(12) United States Patent
Kim et al.

(10) Patent No.: US 6,237,050 B1
(45) Date of Patent: May 22, 2001

(54) METHOD FOR CONTROLLING COMPONENTS OF SEMICONDUCTOR FABRICATING EQUIPMENT ARRANGED IN A PROCESSING LINE

(75) Inventors: Sung-geun Kim; Tae-hyung Kim, both of Kyonggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/148,631

(22) Filed: Sep. 4, 1998

(30) Foreign Application Priority Data

Dec. 26, 1997 (KR) .................................................. 97-74013

(51) Int. Cl.[7] ....................................................... G06F 13/10
(52) U.S. Cl. ................................. 710/19; 700/28; 700/30; 700/31
(58) Field of Search ................................ 710/15, 18, 19, 710/28, 30, 31

(56) References Cited

U.S. PATENT DOCUMENTS

| | | | |
|---|---|---|---|
| 3,344,406 | * 9/1967 | Vinal | 340/172.5 |
| 3,702,989 | * 11/1972 | Provenzano, Jr. et al. | 340/172.5 |
| 4,607,325 | * 8/1986 | Horn | 364/151 |
| 5,089,984 | * 2/1992 | Struger et al. | 395/650 |
| 5,428,551 | * 6/1995 | Trainor et al. | 364/483 |
| 5,612,864 | * 3/1997 | Henderson | 364/167.01 |
| 5,754,451 | * 5/1998 | Williams | 364/551.01 |

* cited by examiner

Primary Examiner—Thomas Lee
Assistant Examiner—Thuan Du
(74) Attorney, Agent, or Firm—Jones Volentine, L.L.C.

(57) ABSTRACT

A method for controlling equipment in a semiconductor fabrication system is provided. A host computer automatically receives actual data indicative of an actual state of a unit of equipment for fabricating semiconductor devices. The computer retrieves from a data base stored data indicative of a stored state of the unit. A state change is computed by comparing the actual data with the stored data and the state change is checked against a predetermined threshold. If the state change exceeds the threshold, the data base is updated by storing the actual data, and operation of the equipment is modified. If the state change does not exceed the threshold, the method returns to receiving actual data.

10 Claims, 5 Drawing Sheets

METHOD FOR CONTROLLING COMPONENTS OF SEMICONDUCTOR FABRICATING EQUIPMENT ARRANGED IN A PROCESSING LINE

BACKGROUND OF THE INVENTION

1. Field of the Invention

The present invention relates to a method for controlling equipment in a semiconductor fabrication system and, more particularly, to a method through which discordance between the actual state and stored state of equipment components can be prevented using a unit state change monitoring module included in a host computer. Thereby, the overall efficiency in controlling productivity of the equipment can be considerably enhanced.

2. Description of the Related Art

Generally, the fabrication of semiconductor devices involves highly precise processes that require finely tuned precision equipment. Several pieces of precision equipment are typically employed in sequence and arranged on a semiconductor processing line. The operation of each piece of precision equipment on the line is closely monitored by operators to maintain and enhance the efficiency of the processing line.

As shown in FIG. 1, conventional fabrication equipment 3 are disposed on a conventional processing line. When a lot 10 of workpieces, such as wafers, are introduced into the equipment 3, the equipment 3 performs a fabrication process on the lot 10. The equipment 3 is connected on-line to a host computer 1 through an equipment server (not shown). An operator interface (O/I) 2, for example an operator interface personal computer (O/I PC), is also connected on-line to the host computer 1. Through the O/I 2, an operator informs the host computer 1 that a process using the equipment 3 is about to commence. The host computer 1 immediately downloads preset process settings to the equipment. Process settings may include, for example, a desired process time duration or a desired process temperature. Then the process equipment 3 performs on the workpieces of each lot 10 based on the process settings received.

After the host computer 1 downloads the preset process settings, the equipment 3 operates its one or more subsidiary units or components, for example, loading and unloading ports (not shown) and chambers 4, to perform the process according to the downloaded process settings.

In such a conventional semiconductor fabrication equipment controlling system, when a first unit (e.g., chamber 4a) is in one state (e.g., DOWN), and another unit (e.g., chamber 4b) is in a different state (e.g., UP or RUN), the first unit may need to be changed from the one state to the different state. In such a case the operator must operate directly on the console (not shown) of the equipment 3 to change the state of the first unit. In a separate step, the operator must store the new state of the first unit in the host computer 1 through the O/I 2. Thereafter, the host computer 1 continuously stores in its data base the states of the respective units of the equipment 3 entered by the operator.

However, such a conventional controlling system suffers from several problems. First, the states of the equipment are frequently changed and the host computer of the conventional controlling system cannot automatically recognize the changes in real time. This may result in discordance between equipment state data stored in the data base of the host computer and the actual states of the equipment.

Secondly, due to this discordance, the host computer cannot produce accurate results for controlling the processing line if those results depend on the states of the units of the equipment 3. As a result, it is impossible to properly control the equipment as soon as a unit state is changed by the operator.

Thirdly, the operator using the discordant data from the host computer to calculate the operating rate of the equipment obtains an incorrect rate which may cause the operator to select the wrong operating rate for the following process. This may result in inaccurate control of the whole process line and reduced productivity of the line.

Finally, the states of the equipment units can be changed only by the operator moving to the equipment and operating directly on its console. If the console is positioned away from the O/I 2, such changes may result in reduced efficiency in controlling the equipment.

SUMMARY OF THE INVENTION

It is therefore an object of the present invention to provide a method for controlling states of components of semiconductor fabrication equipment which is capable of preventing discordance between actual states and states stored in the host computer by using a unit state change monitoring module included in the host computer which handles state data automatically in real time.

It is still another object of the present invention to accurately control the overall productivity of the processing line by retrieving component state data from the host computer that are in accord with the actual states of the equipment. It is still another object of the present invention to enhance the overall efficiency of the processing line by making it possible to change the component states remotely through the host computer.

To achieve the above objects and other objects and advantages of the present invention, the method for controlling equipment in a semiconductor fabrication system includes automatically receiving, at a host computer, actual data indicative of an actual state of a unit of equipment for fabricating semiconductor devices. Then stored data indicative of a stored state of the unit of equipment are retrieved from a data base. A state change is computed by comparing the actual data with the stored data and it is determined whether the state change exceeds a predetermined threshold. If the state change does not exceed the threshold, the method returns to the automatic receiving of actual data. If the state change does exceed the threshold, the data base is primarily updated by storing the actual data, and an operation of the equipment is modified.

According to the present invention, the component state data stored in the host computer are appropriately updated according to the changes in the actual state of the component.

BRIEF DESCRIPTION OF THE DRAWINGS

The present invention is described in detail with reference to the accompanying drawings, in which.

DETAILED DESCRIPTION OF THE PREFERRED EMBODIMENTS

The present invention now will be described more fully hereinafter with reference to the accompanying drawings. In this specification, it is understood that equipment can refer to a stand-alone apparatus or a system of such apparatuses. It is also understood that the state of equipment can be the value of a single parameter or an array of values corresponding to several parameters, and that the values may have a binary domain (e.g., 0/1, ON/OFF, UP/DOWN or RUN/DOWN), a discrete domain (e.g., 0/1/2/3, or LOW/MEDIUM/HIGH), or a substantially continuous domain (e.g., temperatures, pressures, or thicknesses deposited on workpieces). It is also understood that any predetermined values can be provided in any number of conventional ways known to those of ordinary skill in the art, including, for example, a database on an on-line storage device, a look-up-table, and manual input by an operator.

Figure 1:
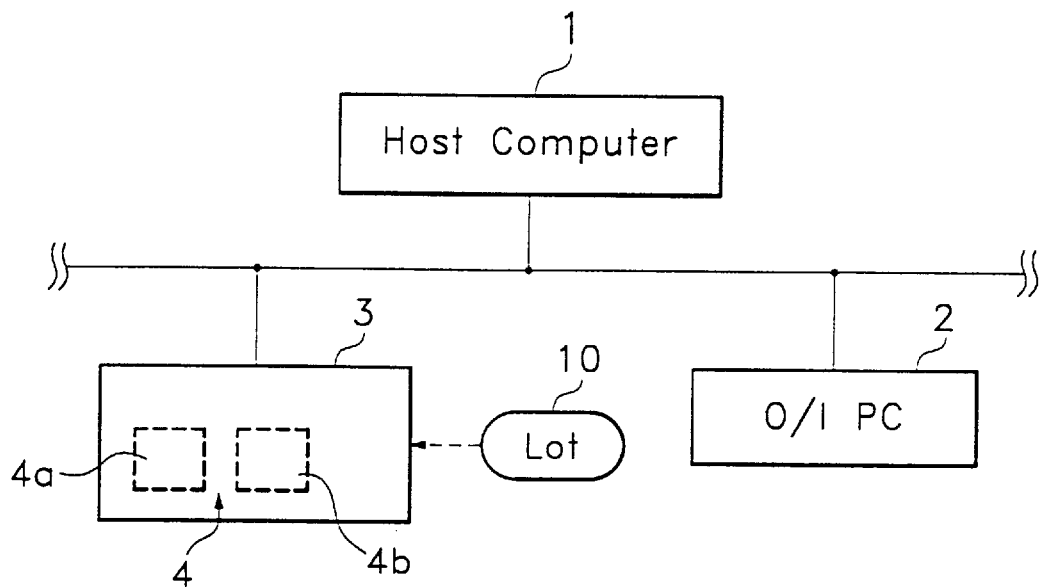
FIG 1. is a schematic diagram of a conventional controlling system for semiconductor fabrication equipment.
Figure 2:
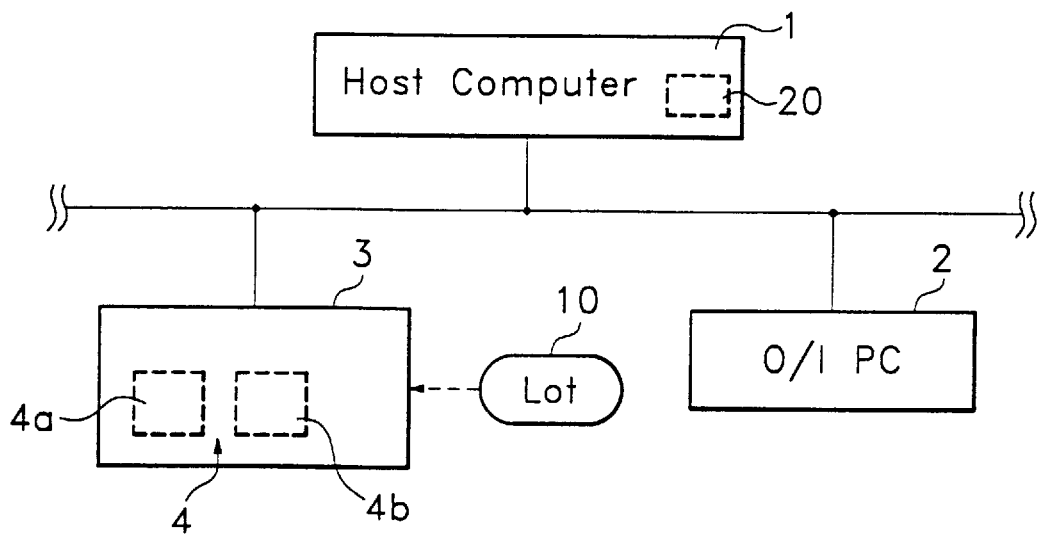
FIG. 2 is a schematic diagram of a controlling system for semiconductor fabrication equipment using the present invention.

As shown in FIG. 2, a host computer 1 includes a unit state change monitoring module 20 which monitors changes in equipment states automatically uploaded from equipment 3 through an equipment server (not shown) and which updates state data stored in a data base in the host computer 1 as appropriate. As a result, the stored state data can be updated immediately when any appropriate change occurs in the state of the equipment 3.

Thereafter, the host computer 1 can use the updated data base to correctly inform the operator of the state of the unit of the equipment 3 when a product is being introduced into the unit. Thereby, problems caused when the workpiece is introduced into units that are DOWN can be prevented. The host computer 1 can also accurately compute the operating rate of the equipment so that subsequent and precedent processing on the line can be properly controlled. The module 20 also can allow the operator to enter equipment state changes remotely at the O/I 2. Then the host computer 1 automatically downloads those changes to the equipment 3 while, substantially simultaneously, updating the data base on the host computer 1.

Figure 3:
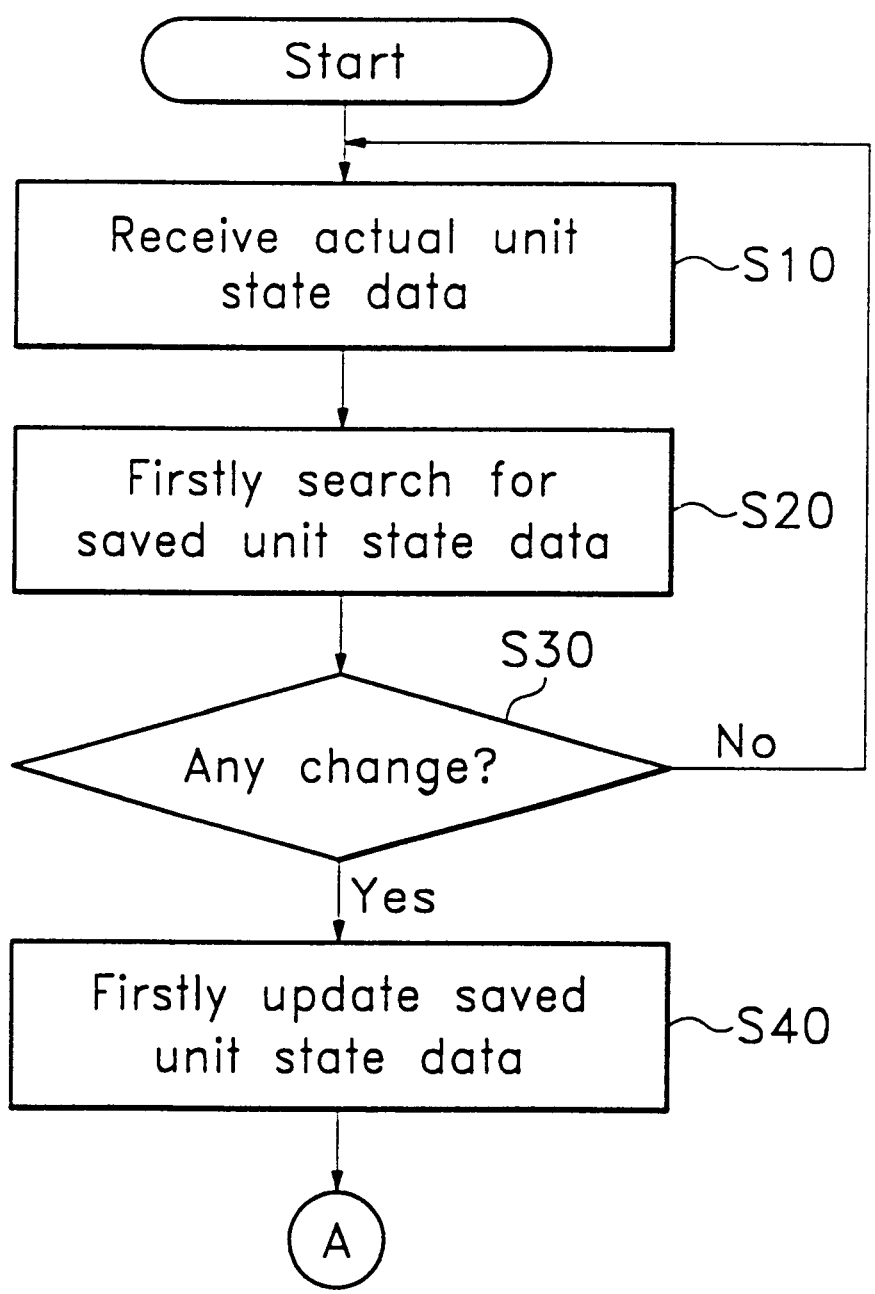
FIG. 3 is a flowchart of a method for controlling equipment in a semiconductor fabrication system according to the present invention.
Figure 4:
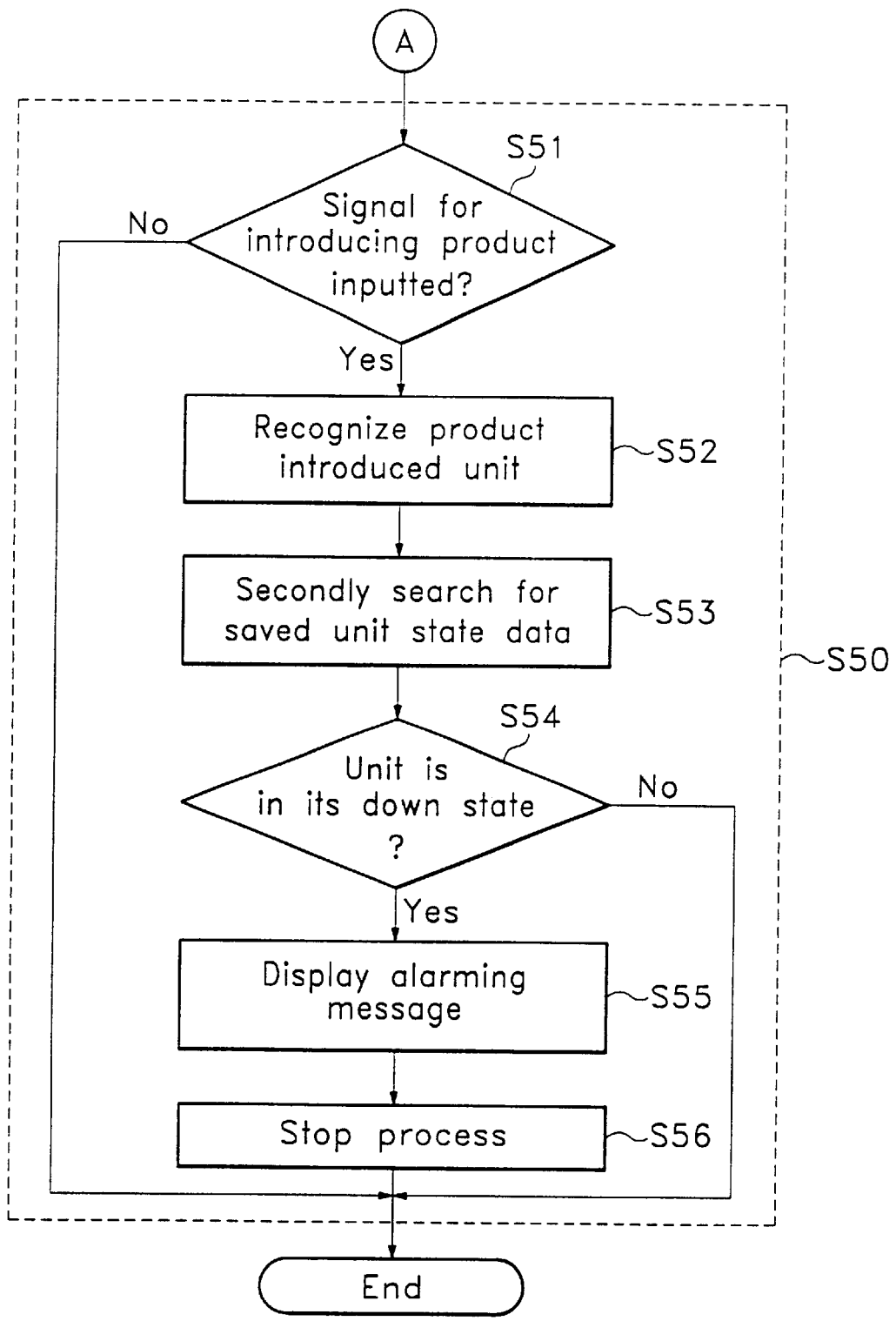
FIG. 4 is a flowchart of a first preferred embodiment of the present invention.
Figure 5:
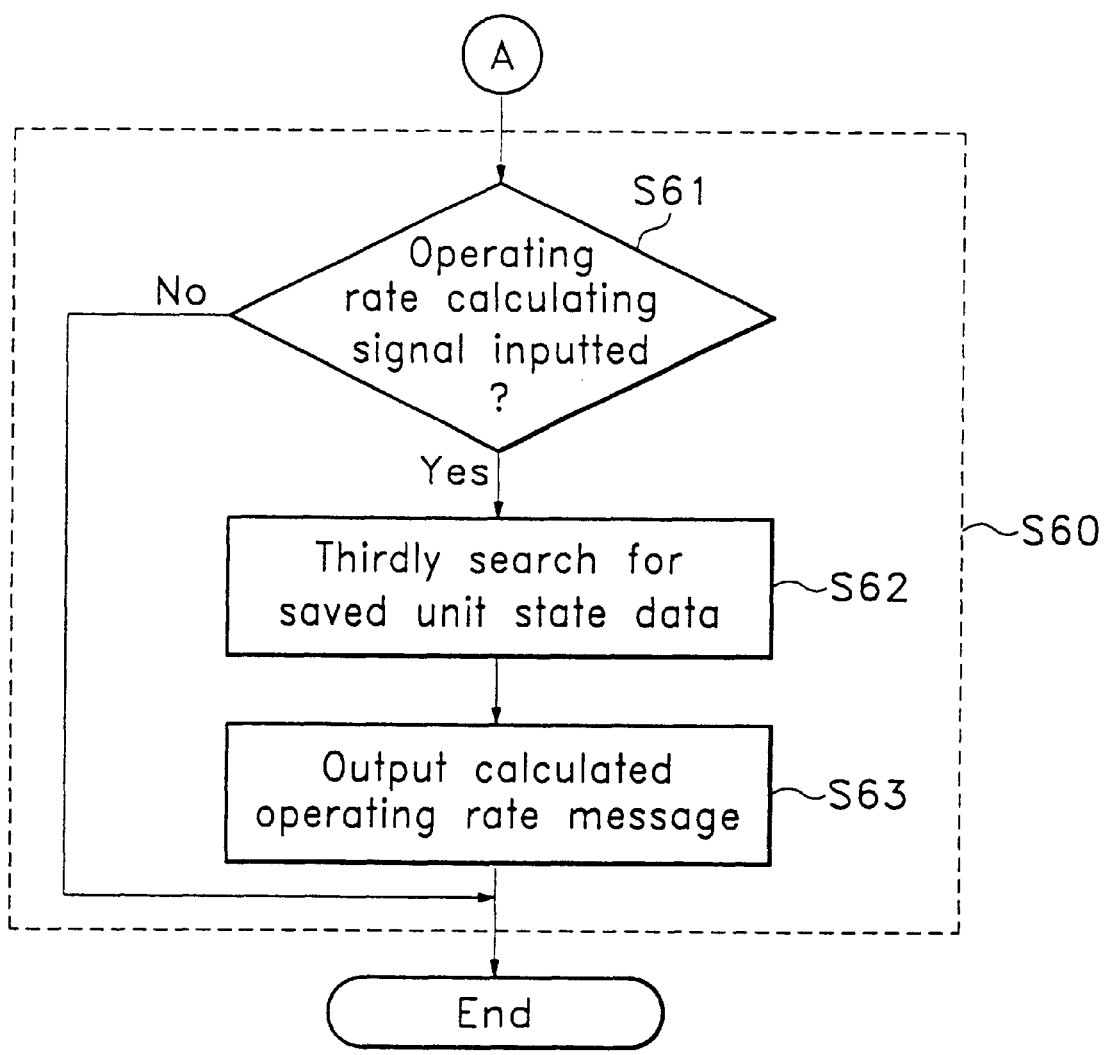
FIG. 5 is a flowchart of a second preferred embodiment of the present invention.
Figure 6:
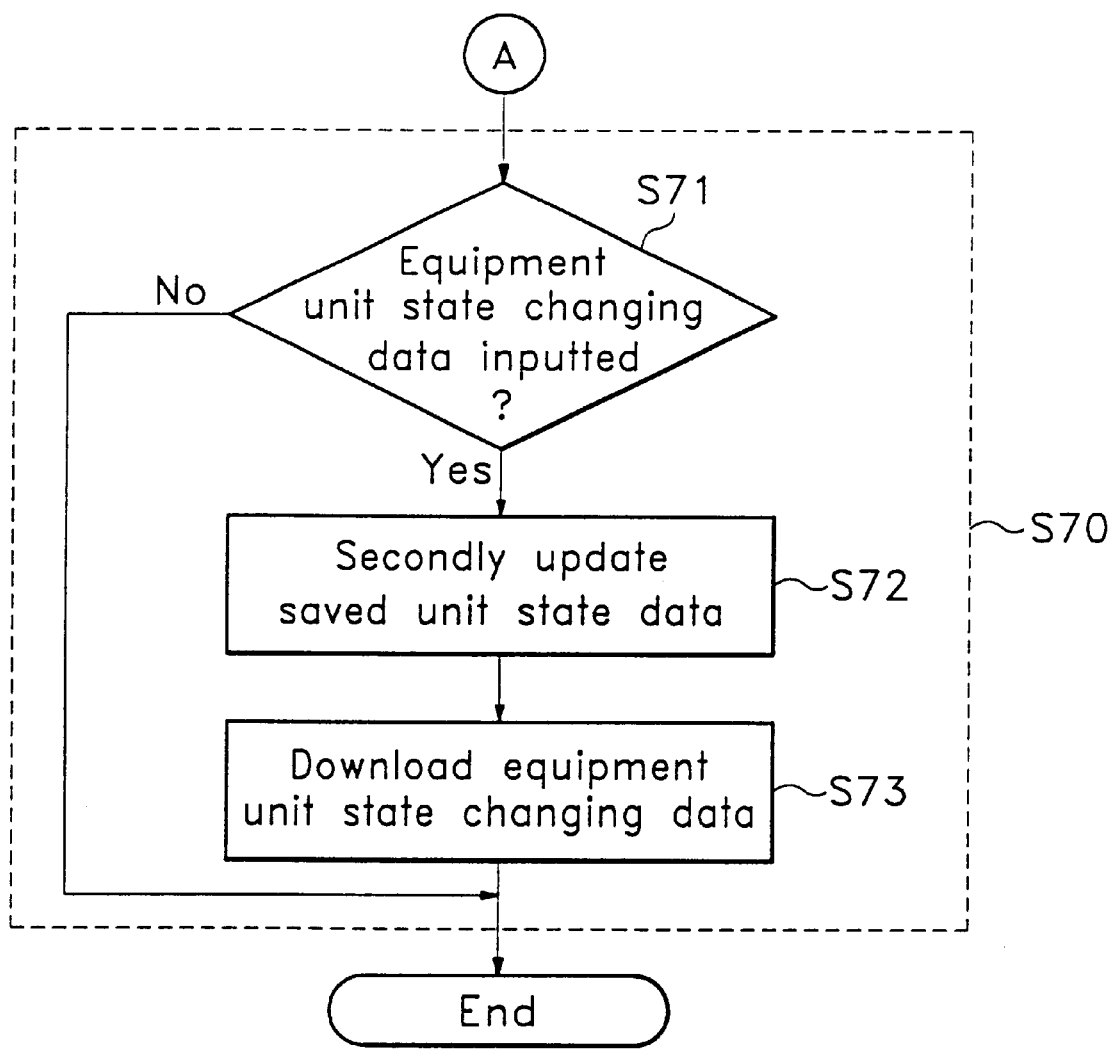
FIG. 6 is a flowchart of a third preferred embodiment of the present invention.

FIG. 3 is a flowchart for the method according to the present invention. FIGS. 4–6 are flowcharts of preferred embodiments of the present invention.

Briefly, as shown in FIG. 3, the method for controlling equipment 3 in a semiconductor fabrication system includes receiving actual unit state data for the equipment 3 automatically (S10); searching for and retrieving stored unit state data corresponding to that equipment from a data base (S20); comparing the actual state data with the stored state data and determining whether a predetermined threshold change has occurred in the state of a unit of the equipment (S30); and continuing to receive the actual unit state data (S10), if it is determined that the predetermined threshold change has not occurred; and updating the contents of the stored state data according to the contents of the actual state data (S40), if it is determined that the predetermined threshold change has occurred. The respective steps of the present invention will be described in detail hereinafter.

First, the unit state change monitoring module 20 on the host computer 1 receives actual state data related to the equipment and its units in real time automatically (S10). The receipt can be a "pull" in which the module 20 monitors the states of the equipment 3 on a regular schedule, or the receipt can be a "push" in which the equipment 3 reports its states when a predetermined reportable state change occurs in the equipment 3, for example, when the operator changes the state of the equipment. As a result, the changes in the states of the equipment 3 can be immediately recognized by the unit state change monitoring module 20 in real time.

Thereafter, the monitoring module 20 of the host computer 1 retrieves stored state data corresponding to the equipment 3 from a data base of the host computer 1 (S20). The stored state data consists of actual equipment units states previously stored by the host computer. It is understood that the term "retrieve" indicates search and extract, or query using a command in a standard query language, or any other conventional means to receive saved data from a data base. The monitoring module 20 of the host computer 1 then determines whether there is any discordance—a difference between the stored state data and the actual state data which indicates a substantial change has occurred in the actual state of the equipment (S30). Discordance indicating a substantial change can be determined if the difference between the actual and stored state data exceeds a predetermined threshold state change. This predetermined threshold state change need not be the same as the predetermined reportable state change sometimes used in step S10 to "push" data from the equipment 3 to host computer 1.

If there is no discordance between the stored unit state data and the actual unit state data, the module 20 returns to the aforementioned initial step S10 of continuously receiving the actual state data.

Otherwise, if there is discordance between the stored state data and the actual state data, the module 20 updates the database by replacing the contents of the stored state data corresponding to the equipment 3 with the value or values of the actual state data corresponding to that equipment 3 (S40). Accordingly, the contents of the stored state data are appropriately changed to the contents of the actual state data for all the units of the equipment 3.

For example, if the values of the actual state data are that a first chamber 4a of the equipment 3 is UP and a second chamber 4b thereof is DOWN, and the contents of the stored state data are that both the first and second chambers 4a, 4b of the equipment 3 are UP, then the module 20 updates the contents of the stored state data so that they are changed into a first chamber 4a which is UP and a second chamber 4b which is DOWN. As a result, the discordance between the stored state data and the actual state data can be removed.

Therefore, according to the present invention discordance between actual state and the stored state data can be removed almost immediately, and the host computer 1 can subsequently accurately control the equipment 3 based on correct values of the states of the units of that equipment 3 in a manner modified compared to the manner that would be used if the discordance were not removed.

There are three preferred embodiments for the modified operation of the equipment 3 described below with reference to FIGS. 4–6. In the following the end of the method is indicated in the FIGS. and is described in the preferred embodiments as terminating the controlling flow of the method. It is understood that, in other embodiments of the present invention, terminating the controlling flow can be replaced by returning to the step of receiving actual state data S10.

Referring to FIG. 4, a first preferred embodiment (S50) includes, after the step S40 of updating the contents of the stored unit state data, the steps of: determining whether an introduction signal for introducing a product into a selected unit of equipment has been input into the O/I 2 or not (S51); terminating the controlling flow if it is determined that the introduction signal has not been input; recognizing the selected unit of equipment (S52) and retrieving stored state data corresponding to the selected unit of equipment (S53) and determining whether the selected unit is DOWN or not (S54), if it is determined that the introduction signal has been input; terminating the controlling flow if it is determined that the selected unit is not DOWN; and displaying an alarming message (S55) and stopping the process (S56) if it is determined that the selected unit is DOWN.

The respective steps of the first preferred embodiment of the method according to the present invention will be described in more detail hereinafter.

First, after step S40, the host computer 1 determines whether an introduction signal for introducing a lot 10 has been input through the O/I 2 or not (S51). If it is determined that the introduction signal has not been input, the host computer 1 terminates the controlling flow of the present method. Otherwise, if it is determined that the introduction signal has been input, the host computer 1 identifies the selected unit of equipment 3 into which the lot 10 is to be introduced (S 52). Thereafter, the host computer 1 retrieves selected stored state data corresponding to the selected equipment from the data base and determines whether the selected unit is DOWN or not (S53 and S54).

If it is determined that the selected unit is not DOWN, the host computer 1 terminates the controlling flow of the present method and allows the lot 10 to be appropriately processed in the selected equipment using the unit. Otherwise, if it is determined that the selected unit is DOWN, the host computer 1 displays an alarming message through the O/I 2, e.g., at the O/I PC 2, and modifies the equipment operation of the whole system by stopping the process (S55 and S56). Accordingly, problems caused when a lot 10 is introduced into a selected unit of equipment that is DOWN can be avoided.

For example, when the operator inputs a signal for introducing the lot 10 into the second chamber 4b that is DOWN through the O/I PC 2, the host computer 1 immediately recognizes the second chamber 4b is DOWN by retrieving from the data base the stored state data. The host computer 1 then downloads an alarming message, e.g., "The second chamber is DOWN," into the O/I PC 2. The host computer 1 then controls the whole system to stop the process. As a result, performance of the process in the second chamber 4b while it is DOWN can be prevented, and the operator can take an appropriate action for changing the state from DOWN to some state that is not DOWN, for example, by performing maintenance or repair.

As aforementioned, in the first preferred embodiment of the present invention, it is possible to prevent a lot 10 from being introduced into a selected unit of equipment that is DOWN, and, thereby, to prevent in advance production failures that may occur when a lot 10 is introduced into equipment that is DOWN, such as producing defective wafers.

Referring to FIG. 5, a second preferred embodiment (S60) of the present invention includes, after the step S40, the steps of: determining whether a predetermined rate signal for calculating the operating rate of the equipment 3 has been input or not (S61); terminating the controlling flow if it is determined that the rate signal has not been input; and retrieving new stored state data and outputting a predetermined calculated operating rate message including the stored state data if it is determined that the rate signal has been input (S62 and S63).

The respective steps of the second embodiment of the unit state controlling method according to the present invention will be described in detail hereinafter.

First, after the step S40, the host computer 1 determines whether a rate signal has been input through the O/I 2 indicating that the operating rate of the equipment 3 is to be calculated (S61). If it is determined that the rate signal has not been input, the host computer 1 terminates the controlling flow of the present method. Otherwise, if it is determined that the rate signal has been input, the host computer 1 is informed that the operator wants to know the operating rate of the equipment 3. In this case the host computer 1 again retrieves stored data, yielding new stored data indicative of the states of the equipment units, calculates the operating rate using the new stored data, and outputs an operating rate message containing the operating rate and the stored data into the O/I 2 (S62 and S63). As a result, the operator can accurately obtain the operating rate of the equipment.

In the conventional method, stored state data are different from the actual state of the equipment much of the time, and the operating rate of the equipment 3 calculated with discordant stored data is inaccurate. As a result, the overall productivity of the equipment 3 cannot be accurately controlled. For example, if the rate signal is input while the host computer 1 uses stored state data indicating the second chamber 4b of the equipment 3 is UP though the actual state of the second chamber 4b is DOWN, the host computer 1 calculates the operating rate of the equipment 3 as 50%. This is because the host computer 1 determines that only 50% of products are being produced that should be produced when both chambers are running, i.e., when the states of both chambers are UP. As a result, the conventional method will cause the process line control system to perform under the mistaken notion that equipment 3 can be operated at greater capacity than it actually can.

However, according to the present invention, the stored state data on the host computer 1 is the same as the actual state of the equipment 3. Accordingly, when the operator commands the host computer 1 to output the operating rate of the equipment, the host computer 1 outputs an accurate operating rate calculated with the stored state data. As a result, the accurately calculated operating rate appropriately affects the equipment and the following processes on the process line, and the productivity of the equipment 3 can be accurately controlled by the control system. For example, if the state of the second chamber 4b of the equipment 3 is DOWN, the host computer 1, using the updated data base in which the stored data contains the stored state of the second chamber 4b as DOWN, accurately recognizes the state of the second chamber 4b as DOWN. Accordingly, when the rate signal is input, the host computer 1 calculates the operating rate as 100%. This is because the host computer determines that all the products that can be processed in half the chambers 4a, 4b are being processed. As a result, the overall productivity of the equipment 3 can be accurately controlled, i.e., the present invention causes the process line control system to perform with the accurate information that equipment 3 is operating at the full capacity it actually can.

Referring to FIG. 6, a third preferred embodiment (S70) of the present invention includes, after the step S40, the steps of: determining whether a change signal, indicative of the operator changing the state of a unit of the equipment 3, has been input through the O/I 2 or not (S71); terminating controlling flow of the present method if it is determined that the change signal has not been input, and secondarily updating the data base and also downloading some changed unit state data into the equipment 3, if it is determined that the change signal has been input (S72 and S73).

The respective steps of the third preferred embodiment of the present invention will be described in detail hereinafter.

First, after the step S40, the host computer 1 determines whether a change signal indicative of changing the state of a unit has been input through the O/I 2 or not (S71), whereby the operator changes the units of the equipment remotely. If it is determined that the change signal has not been input, the host computer 1 determines that the operator is not indirectly, i.e., is not remotely, controlling the units of the equipment 3, and the host computer 1 terminates the controlling flow of the present method. Otherwise, if it is determined that the change signal has been input, the host computer 1 determines that the operator is remotely controlling the equipment 3 and derives changed state data for the units of the equipment 3 from the change signal. The host computer 1 then updates the database by replacing the contents of the stored state data corresponding to the units of the equipment 3 with the value or values of the changed state data corresponding to those units (S72). Accordingly, the contents of the stored state data are appropriately changed to the contents of the changed state data. Thereafter, the host computer 1 downloads the changed state data into the equipment 3 (S73) and the equipment operates, with units in the changed states, on the lot of workpieces. As a result, the states of the units of the equipment 3 are appropriately changed according to the change signal input by the operator, remotely through the system O/I 2 instead of through the equipment's own console as in the conventional method. According to the present invention, as the units' states are remotely changed, the data base is substantially simultaneously updated to accurately reflect the change.

For example, if the change state data of the change signal includes "Change the state of the first chamber 4a from UP to DOWN," the equipment 3 receives the equipment state changing data through the host computer 1 and changes the state of the first chamber 4a from UP to DOWN and also updates the data base. As a result, the state of the first chamber 4a is remotely changed from UP to DOWN almost immediately. And substantially simultaneously, the data base is updated so that the stored state of the units of the equipment 3 includes a stored value of DOWN for the first chamber 4a.

In contrast, in the conventional method, the operator changes the state of the equipment at a console of the equipment which may be located away from the O/I 2. As a result, the overall efficiency of operating the equipment 3 is considerably reduced. According to the present invention, the operator can change the state of the equipment 3 indirectly by remotely controlling through the O/I 2 that is on-line to the host computer 1. As a result, the overall efficiency of operating the equipment can be considerably enhanced.

Furthermore, because the data base is updated immediately according to the present invention, when the operating rate of the equipment is calculated, the stored state data are the same as the actual state data and the operating rate calculation is accurate. In the conventional method there is some delay between changing the equipment state and updating the data base.

For example, if the state of the first chamber 4a is changed from UP to the DOWN by remote control of the operator through the O/I PC 2, the host computer 1 changes the stored state data of the first chamber 4a from UP to DOWN at substantially the same time. As a result, when the operating rate is calculated based on retrieving the stored data, the stored data are accurate, and consequently the calculated operating rate is accurate. However, in the conventional system, if the state of the first chamber 4a is changed from UP to the DOWN by the operator at the console, the stored state data on the host computer 1 are not immediately updated. As a result, when the operating rate is calculated based on retrieving the stored data before the operator updates the data base manually, the stored data are inaccurate, and consequently the calculated operating rate is inaccurate. Accordingly, the present invention prevents a problem in controlling the productivity of the equipment 3, which may occur in the conventional method when the operational rate is computed before the operator updates the data base.

In the preferred embodiments, the host computer 1 repeatedly carries out the aforementioned steps through the unit state change monitoring module 20 to prevent discordance between the actual state of the equipment and the stored state data in the host computer, and thereby the equipment of the process line can be efficiently controlled.

According to the present invention, therefore, the problems with the conventional method are overcome. First, the discordance between the stored state and the actual state of the units can be prevented. Second, the equipment can be accurately controlled through the host computer. Third, the overall productivity of the process line equipment can be accurately controlled. Fourth, the states of the equipment units can be changed remotely through the host computer and thereby the efficiency of operation of the equipment can be considerably enhanced.

This invention has been described above with reference to the aforementioned embodiments. It is evident, however, that many alternatives, modifications and variations will be apparent to those having skill in the art in light of the foregoing description. For example, the present invention may be applied to a variety of semiconductor fabricating equipment which require predetermined control. Accordingly, the present invention embraces all such alternatives, modifications and variations as fall within the spirit and scope of the appended claims and their equivalents.

What is claimed is:

1. A method for controlling equipment in a semiconductor fabrication system, the method comprising:

automatically receiving, at a host computer, actual data indicative of an actual state of a unit of equipment for fabricating semiconductor devices through a unit state change monitoring module provided in the host computer;

retrieving, from a data base, stored data indicative of a stored state of the unit of equipment;

computing a unit state change by comparing the actual data with the stored data;

determining whether the unit state change exceeds a predetermined threshold;

returning to said receiving, if the unit state change does not exceed the predetermined threshold;

primarily updating the data base by storing the actual data, if the unit state change does exceed the predetermined threshold; and modifying an operation of the unit of equipment after said primarily updating of the data base, said modifying including determining whether a predetermined introduction signal indicative of introduction of a workpiece into a selected unit of equipment, has been input to the host computer, identifying the selected unit of equipment indicated by the predetermined introduction signal, if the predetermined introduction signal has been input, retrieving selected stored data from the data base after said identifying, the selected stored data indicative of a running state of the selected unit of equipment, determining whether the selected stored data has a down value indicative that the selected unit of equipment is in a down state, after said retrieving of the selected stored data, displaying a predetermined alarm message, if the selected stored data has the down value, and stopping the introduction of the workpiece, after said displaying.

2. The method of claim 1, wherein said modifying comprises:

determining whether a predetermined change signal indicative of changing a state of the unit of the equipment, has been input to the host computer;

deriving changed state data from the predetermined change signal if the predetermined change signal has been input;

secondarily updating the data base by storing the changed state data, after said deriving;

downloading the changed state data into the unit of the equipment, after said deriving; and changing the state of the unit of equipment to conform to the changed state data, after said downloading.

3. The method of claim 2, wherein said modifying further comprises terminating the method, if the predetermined change signal has not been input.

4. The method of claim 1, wherein said receiving is performed when the host computer interrogates the unit of the equipment in accordance with a predetermined schedule.

5. The method of claim 1, wherein said receiving is performed when the unit of the equipment notifies the host computer that a predetermined reportable change in a state of the unit of the equipment has occurred.

6. The method of claim 1, wherein said modifying further comprises:

terminating the method, if the predetermined introduction signal has not been input; and terminating the method, if the selected stored data does not have the down value.

7. A method for controlling equipment in a semiconductor fabrication system, the method comprising:

automatically receiving, at a host computer, actual data indicative of an actual state of a unit of equipment for fabricating semiconductor devices through a unit state change monitoring module provided in the host computer;

retrieving, from a data base, stored data indicative of a stored state of the unit of equipment;

computing a unit state change by comparing the actual data with the stored data;

determining whether the unit state change exceeds a predetermined threshold;

returning to said receiving, if the unit state change does not exceed the predetermined threshold;

primarily updating the data base by storing the actual data, if the unit state change does exceed the predetermined threshold; and modifying an operation of the unit of equipment after said primarily updating of the data base, said modifying including determining whether a predetermined rate signal indicative of calculating an operating rate for the unit of the equipment, has been input to the host computer, retrieving new stored data indicative of the stored state of the unit of the equipment, if the predetermined rate signal has been input, calculating the operating rate of the unit of the equipment with the new stored data after said retrieving of the new stored data, and outputting an operating rate message including the calculated operating rate after said calculating.

8. The method of claim 7, wherein said modifying further comprises terminating the method, if the rate predetermined signal has not been input.

9. The method of claim 7, wherein said receiving is performed when the host computer interrogates the unit of the equipment in accordance with a predetermined schedule.

10. The method of claim 7, wherein said receiving is performed when the unit of the equipment notifies the host computer that a predetermined reportable change in a state of the unit of the equipment has occurred.

* * * * *